United States Patent [19]

Poris

[11] Patent Number: 5,256,274
[45] Date of Patent: Oct. 26, 1993

[54] SELECTIVE METAL ELECTRODEPOSITION PROCESS

[76] Inventor: Jaime Poris, 409 Capitola Ave., Capitola, Calif. 95010

[21] Appl. No.: 799,734

[22] Filed: Nov. 22, 1991

Related U.S. Application Data

[63] Continuation-in-part of Ser. No. 561,168, Aug. 1, 1990.

[51] Int. Cl.$^5$ ............................................... C25D 1/00
[52] U.S. Cl. ..................................... 205/123; 205/223
[58] Field of Search ............................... 205/123, 223

[56] References Cited

U.S. PATENT DOCUMENTS

| | | | |
|---|---|---|---|
| 3,708,403 | 1/1973 | Koger et al. | 205/123 |
| 4,137,867 | 2/1979 | Aigo | 427/27 |
| 4,624,749 | 11/1986 | Black et al. | 205/123 |
| 4,687,552 | 8/1987 | Early et al. | 205/123 |
| 4,861,452 | 8/1989 | Stierman et al. | 204/297 W |
| 4,927,505 | 5/1990 | Sharma et al. | 204/192.25 |
| 4,985,750 | 1/1991 | Hoshimo | 357/71 |

OTHER PUBLICATIONS

Article regarding selective gold plating by D. C. Shaver, D. C. Flanders, N. M. Ceglio and H. I. Smith, *J. Vac. Sci. Tech.*, vol. 16, #6, p1626, Nov./Dec. 1979.
Article regarding selective gold plating by E. Spiller, et al., *Solid State Technology*, p. 62, Apr. 1976.
Article regarding selective gold plating by D. Summers, *Solid State Technology*, p. 137, Dec. 1983.
Article regarding copper plating into blind vias by E. K. Yung, et al., *Journal of the Electrochemical Society*, vol. 136, #1, p. 206, Jan. 1989.
Article regarding electropolishing by H. M. Hojka, et al., *Journal of the Electrochemical Society*, vol. 126, p. 795, May 1979.
Article regarding diffusion of metals in silicon dioxide by J. D. McBrayer, et al., *Journal of the Electrochemical Society*, vol. 133, #6, p. 1242, Jun. 1986.
Article regarding silver diffusion in titanium nitride by N. Von Seefeld, et al., *IEEE TED*, vol. ED-27, #4, p. 873, Apr. 1980.
Article regarding diffusion barriers for copper, by C. K. Hu, et al., *VMIC Conference Proceedings*, p. 181, Jun. 1986.
Article regarding copper diffusion in titanium nitride, by M. A. Nicolet, et al., *J. Vac. Sci. Tech.*, vol. 19, #3, p. 786, Sep./Oct. 1981.

*Primary Examiner*—John Niebling
*Assistant Examiner*—Kishor Mayekar
*Attorney, Agent, or Firm*—Heller, Ehrman, White & McAuliffe

[57] ABSTRACT

A process and apparatus for advanced semiconductor applications which involves the selective electrodeposition of metal on a semiconductor wafer is described. The present invention has significant economic and performance advantages over the current state of the art. It addresses problems associated with cleanliness (a major issue with sub-micron processing), metal thickness uniformity, step coverage and environmental concerns.

A metal with better device performance capabilities compared to the standard aluminum is also employed. The hardware allows the selective deposition to occur without allowing the electrolyte to contact the rear of the wafer or the electrodes contacting the front wafer surface. A virtual anode improves the primary current distribution improving the thickness uniformity while allowing optimization of other film parameters with the remaining deposition variables. Using this process and the associated hardware, metal lines are selectively deposited with contacts or vias completely filled without the need for plasma etching the deposited metal.

9 Claims, 7 Drawing Sheets

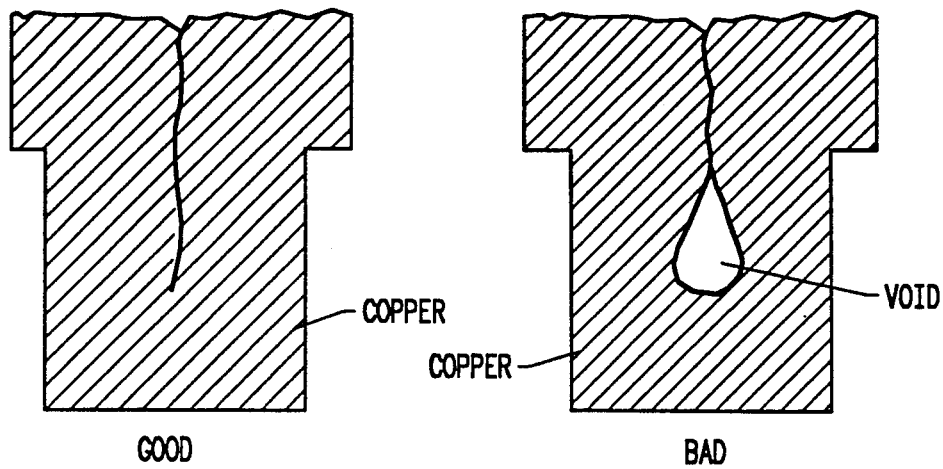
FIG. 1A GOOD  FIG. 1B BAD
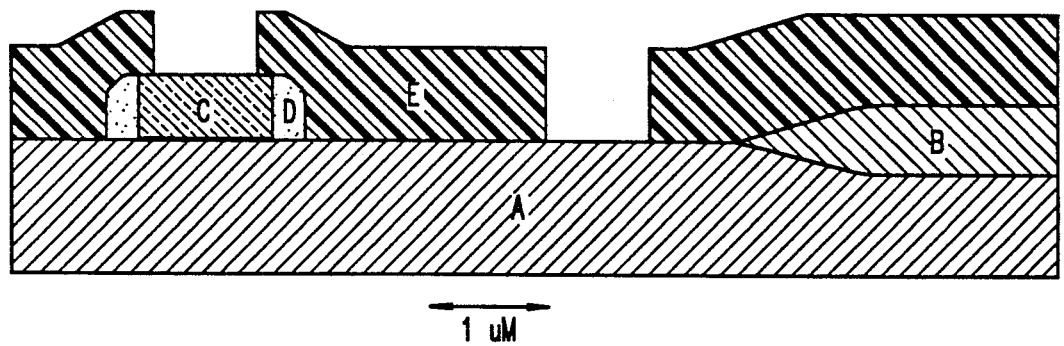
FIG. 2

CROSS SECTION OF CELL

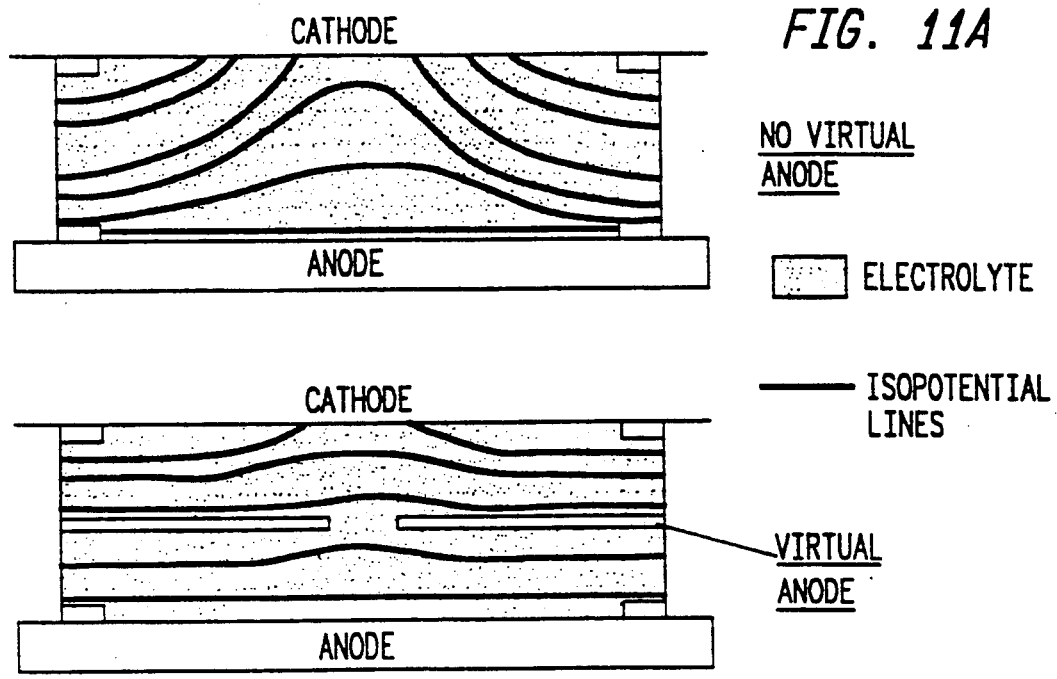
FIG. 11A
FIG. 11B
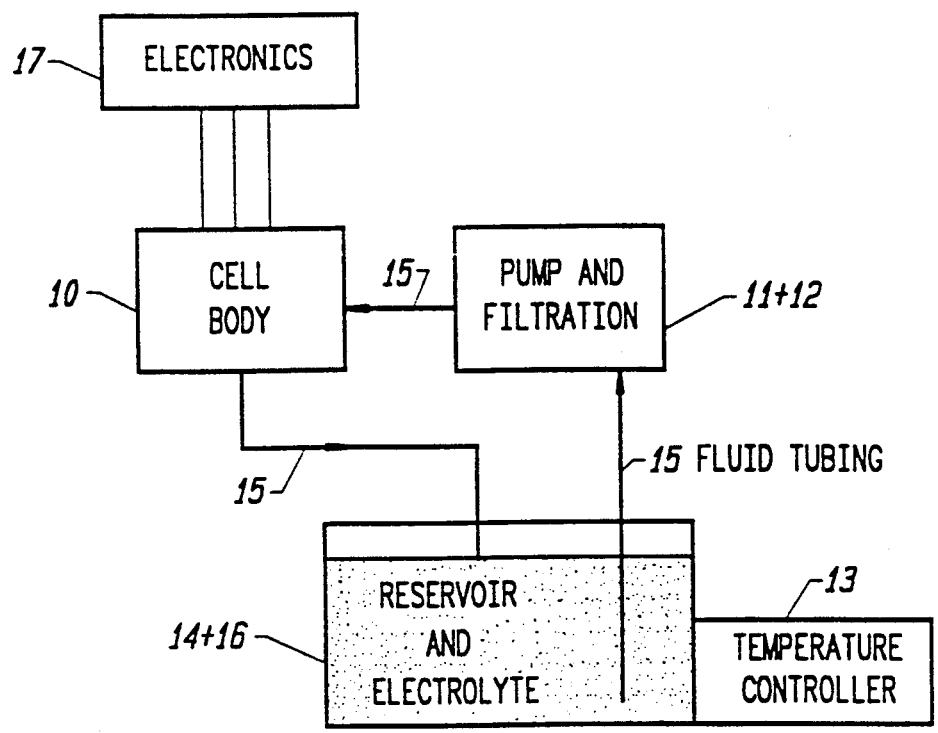
FIG. 12

SELECTIVE METAL ELECTRODEPOSITION PROCESS

This is a continuation-in-part of application Ser. No. 07/561,168 filed Aug. 1, 1990.

BACKGROUND OF THE INVENTION

The present invention relates to a selective metal electrodeposition process and apparatus.

Following is a list of the most important requirements for metallization processes for advanced semiconductor processing:

- low metal resistivity (comparable to or less than that of aluminum)
- low contact resistance to the active device area (a requirement of the diffusion barrier and not the current carrying metal)
- low contact resistance to previous and subsequent metallization steps
- excellent contact and via step coverage capability
- acceptable film morphology, adhesion and stress properties
- decreased line-to-line capacitance
- improved planarization processing
- compatibility with planarization processing
- compatibility with other processing (such as salicides and dielectric depositions)
- competitive economics and throughout considerations
- excellent reliability (electromigration and corrosion concerns)
- environmentally responsible process

COMPARISON WITH CURRENT AND PROPOSED METALLIZATION PROCESSES

Sputtered aluminum has electromigration and step coverage concerns. Electromigration is an atomic transport mechanism which allows metal atoms to move due to an applied direct current resulting in the formation of voids in a metal line. These voids can cause an increase in line resistance and ultimately the opening of a line (open circuit). Step coverage describes the ability of the metal to fill contact and via holes. This directly affects the ability of the metal to carry current into and out of the contacts and vias. Poor step coverage may lead to the failure (open circuit) of the metal in the hole.

Subsequent processing (planarization and stacking vias on top of contacts) is also complicated by poor step coverage. Layering the aluminum with a more electromigration resistant metal or alloying the aluminum (forming new phases at the sensitive grain boundaries) are two approaches to reduce the probability of this failure mechanism. They are only partial solutions and introduce other problems such as complicating the metal etch step and increasing the sheet resistance of the metal. Solving the step coverage problem with standard sputtering techniques has also convincingly failed.

LPCVD (low pressure chemical vapor deposition) aluminum addresses the step coverage issue (LPCVD can provide excellent step coverage) but raises concerns about electromigraton resistance, film morphology (optimum grain size for electromigration resistance) and corrosion resistance. The ability to alloy the aluminum using this technique has not yet been demonstrated nor has its production worthiness.

Hot sputtered aluminum is of questionable production worthiness and electromigration resistance.

Reflowed aluminum requires processing with an expensive laser ($700,000) after standard sputtering. Excellent step coverage is promised, but all problems relating to electromigration are still present.

Blanket LPCVD tungsten is presently economically unattractive as well as exhibiting a much larger resistivity than that of aluminum. Some economic improvements can be expected, but its large resistance requires thick films which results in large fringing (line to line) capacitances which degrade device performance.

Thick lines and lines with sharp edges and corners also complicate subsequent planarization processing. Only a small fraction of current and future process flows will be able to cope with the performance limitations and processing complexities of this metallization scheme. Additionally, plasma etching of tungsten has not proven to be as production worthy a process as that of aluminum etching.

Selective LPCVD tungsten plugs with sputtered aluminum addresses the step coverage problem, but has throughput and economic problems, leakage current concerns when used as the first metallization process and electromigration resistance concerns. The relatively new silane reduction process should address some of the throughput and economic concerns and possibly the junction leakage concerns. Step coverage should be excellent, but electromigration resistance is still an issue.

The selective metal electrodeposition process (utilizing copper) yields a metal with excellent resistivity, approximately 2 micro-ohm-centimeters (this value is superior to that of aluminum, approximately 3 micro-ohm-centimeters).

Step coverage can be manipulated with the deposition parameters (similar to an LPCVD process). The added benefit of adding leveling agents to the electrolyte further aids in achieving excellent step coverage. The economics of an electrochemical deposition process must be compared to other metallization processes. No vacuum pumps, mass flow controllers, sophisticated high temperature furnaces and controllers, toxic gases or toxic gas detectors are necessary.

These facts lead one to conclude that an economical piece of equipment can be manufactured once a production worthy process is established. The simplification of the metal etch step would also have favorable economic consequences. Experimental deposition rates have also been favorable with respect to throughput requirements. The reliability of a copper metallization process must be proven. The fact that copper is already used as an interconnect metal in semiconductor packaging is a beneficial fact. It is also one of the most common and studied metals.

Concerns over other failure mechanisms at the smaller geometries associated with this process will have to be examined. Certainly the failure mechanisms relating to atomic transport mechanisms (electromigration) are of minimal probability due to the relatively high melting point of copper (compared to that of aluminum).

SUMMARY OF THE INVENTION

It is an object of the present invention to provide an improved electrodeposition process.

A selective metal electrodeposition process and its associated hardware will be described which solves the problems associated with current and proposed metallization schemes. The advantages of this process alluded to in Table I will be discussed in detail.

Briefly, in one preferred embodiment, the present invention is directed toward a process for electrodeposition of metal such as copper, silver or gold onto a semiconductor wafer having an active layer such as silicon. The process completes the steps of a diffusion barrier deposition process to provide an electrically conducting layer having contacts and vias on said wafer and to prevent metal diffusion to said silicon, a nucleation layer process to provide a sufficient adhesion surface for the electrodeposited metal, an inert metal mask process to place a first metal mask layer onto said wafer, a selective electrodeposition process to selectively electrodeposit said metal onto said conducting layer of said semiconductor wafer while simultaneously completely filling a contact or via without a standard resist metal etch, a photoresist removal step, and an electrochemical etch process to decrease line-to-line capacitance and simplify planarization processing.

Additional objects, advantages and novel features of the present invention will be set forth in part in the description which follows and in part become apparent to those skilled in the art upon examination of the following or may be learned by practice of the invention. The objects and advantages of the present invention may be realized and attained by means of the instrumentalities and combinations which are pointed out in the appended claims.

BRIEF DESCRIPTION OF THE DRAWINGS

The accompanying drawings which are incorporated in and form a part of this specification illustrate an embodiment of the invention and, together with the description, serve to explain the principles of the invention.

FIG. 1A depicts a diagram of a contact or via filled with proper step coverage.

FIG. 1B depicts a diagram of a contact or via which is improperly filled.

FIGS. 2-8 depict process steps for electrodeposition of a metal according to the present invention.

FIGS. 11A and 11B depict cross-sections of the cell's potential distribution with and without a virtual anode.

FIG. 12 depicts a block diagram of an electrodeposition system according to the present invention.

DETAILED DESCRIPTION OF THE DRAWINGS

Figure 3:
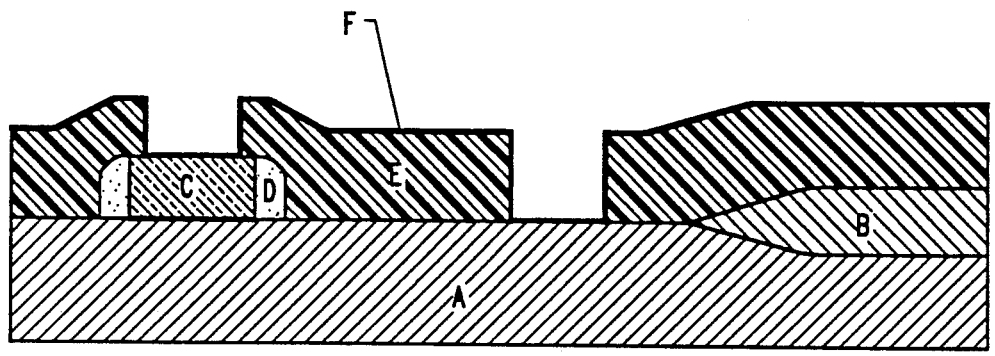
Figure 4:
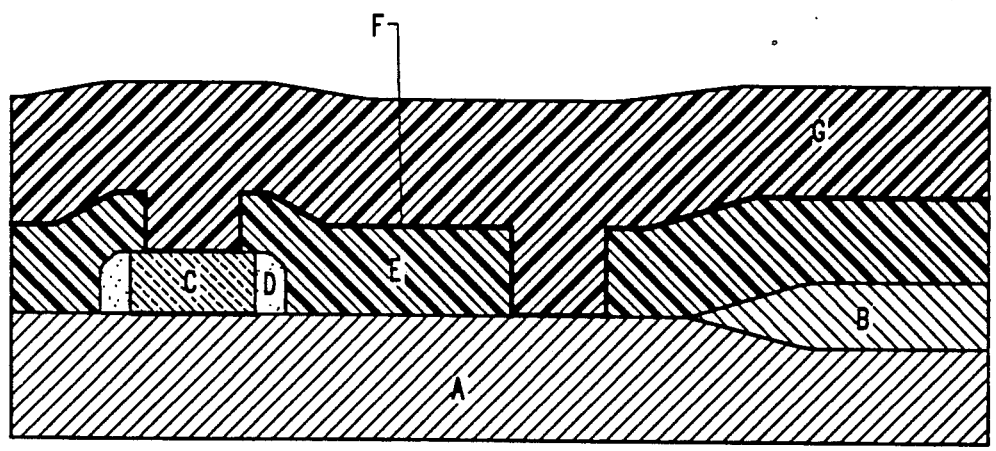

Reference will now be made in detail to the preferred embodiment of the invention, an example of which is illustrated in the accompanying drawings. While the invention will be described in conjunction with the preferred embodiment, it will be understood that it is not intended to limit the invention to that embodiment. On the contrary, it is intended to cover alternatives, modifications and equivalents as may be included within the spirit and scope of the invention as defined by the appended claims.

THE SELECTIVE METAL ELECTRODEPOSITION PROCESS

In this process, deposition of metal (copper for instance) occurs by the electrolysis of a copper ion containing aqueous electrolyte. The physical laws governing this reaction were explained by Faraday in 1833. Simply stated, by passing 96,487 coulombs (an electrical unit of charge) through the two electrodes immersed in the electrolyte, one gram-equivalent of metal is stripped from the anode and deposited on the cathode.

When a direct current (DC) voltage is imposed on the two electrodes, electrons travel from the voltage source into the cathode and out of the anode into the voltage source.

Positive copper ions are attracted to the cathode where they combine with electrons yielding neutral copper which is plated onto the electrode.

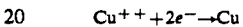
$$Cu^{++} + 2e^- \rightarrow Cu$$

At the anode, electrons are removed from the copper which releases soluble copper ions into the solution.

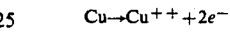
$$Cu \rightarrow Cu^{++} + 2e^-$$

The rate of the cathode reaction is exactly the same as the anode reaction rate, for each copper ion dissolved from the anode, one is plated onto the cathode.

Modifications of this simple procedure are done to improve certain properties of the electrodeposited film. Other ionic species can be added to the electrolyte (sulfuric acid) to improve its conductivity which affects thickness uniformity. Small quantities of additives can modify the film morphology, change the film stress and improve the step coverage. How the voltage or current is applied, temperature, fluid dynamics and cell geometry are other relevant variables.

By using a photoresist patterned wafer for the cathode, metal can be selectively deposited. The wafer will only have plated metal where the resist is not present, electrodeposition cannot occur on the (electrically insulating) photoresist covered areas. The result is a patterned metal layer from the pair of photolithographic and deposition steps compared to the standard deposition, photolithographic and etch steps. This fact has favorable implications in terms of processing complexity and economic considerations (easier and cheaper).

One of the complexities of the process flow according to the present invention is to selectively form a metal line while simultaneously filling a contact or via. Selective line formation process has been previously documented (see the list of references on selective gold plating). The contact or via must be filled with excellent step coverage, a void cannot be tolerated during this step (FIG. 1A). If a void forms (FIG. 1B), it would be filled with electrolyte which could lead to reliability problems due to corrosion or explosion upon heating due to the conversion of the liquid to a gas. This is not a concern with LPCVD because a void would be filled with a gas, not a liquid. This gas would not contribute to corrosion or cause any explosion mechanisms to occur.

The use of an additive (TECHNI-COPPER U additive from Technics Inc.) is one which could be used to allow the step coverage problem to be overcome. The additive promotes what is referred to as micro-levelling in the printed circuit board industry. Micro-levelling is a phenomenon which promotes the growth rate of depressed areas (scratches or surface anomalies in the printed circuit board industry or contacts in this application) and hinders the growth of raised areas (flat metal surfaces or the top perimeter of contacts in this application), it levels the surface.

Micro-levelling also refers to a scale much smaller than lines or vias on printed circuit boards, more similar to the geometries encountered in semiconductor processing. It was developed to promote a smooth metal surface despite the roughness of the substrate, it saves processing time by eliminating a polishing step. When micro-levelling occurs, contacts or vias are filled at a faster rate than the surrounding flat metal areas yielding excellent step coverage (no voids), the contact or via fills up with metal before the metal line is completely formed.

Geometric leveling (the ability to fill a contact or via by obtaining equal deposition rates from all exposed surfaces hence filling a void, often characterized as 100% step coverage in a LPCVD process) and a control of the deposition conditions (no mass transport limitation of the metal ions) also contribute to the excellent step coverage properties of—this process. The result is step coverage in excess of 100%, something not able to be done with LPCVD techniques. In summary, the use of micro-levelling agents, geometric levelling and the control of the mass transport properties during electrodeposition allow the simultaneous filling of contacts or vias as well as photoresist defined metal lines. The results are metal lines with completely filled contacts or vias and no voids formed without the aid of plasma metal etching.

ADVANTAGES OF SELECTIVE METAL ELECTRODEPOSITION

- improved device performance (less time delay and smaller IR voltage drop) due to lower metal resistance for a given thickness compared to higher resistivity metals
- excellent thermal conduction allows possibility of heat-sink metal layer
- economical process allows possibility of thin ground plane metal layers
- selective metal electrodeposition simplifies the small geometry metal etch step
- improved and simplified metal linewidth control
- decreased line-to-line capacitance
- simplified planarization processing
- simplified room temperature process compared to elevated temperature processes
- potential simplification of packaging due to TAB process compatibility with copper and soldering
- simplified planarization processing following metallization due to the reduced metal thickness for a given resistance compared to higher resistivity metals
- simplified task of increasing the number of metal layers because of the simplified planarization processing
- potential economic and throughput advantages compared to present and proposed metallization schemes
- potential environmental advantages due to efficient use of recyclable electrolyte compared to LPCVD and metal etch gases and their by-products

DESCRIPTION OF THE PROCESS FLOW

As with any advanced semiconductor process, integration of the new step into the overall process flow requires as much engineering attention as the new step itself. Some older steps are deleted (such as aluminum sputtering in this instance), some are left unchanged (contact etch), some slightly modified (second dielectric deposition) and some new steps added (adhesion layer deposition).

Following is a general description of the relevant part of a silicon process flow using selective metal electrodeposition. Table II is a schematic of that process flow. It utilizes the selective metal electrodeposition process according to the present invention for the first metal layer (most process flows use at least two metal layers). It would be essentially unchanged for second (or third) metal applications.

Cross sections of a typical wafer surface are shown in FIGS. 2-8 at the end of the indicated process steps. These drawings are approximately 10,000× larger than actual size and represent one small area of the total wafer surface.

PROCESS FLOW

Processing up to and including first dielectric contact etch is shown in FIG. 2 (a process known as self-aligned silicidation (salicide) may precede first dielectric deposition without adverse consequences from this metallization process). A is the active silicon, B is the field oxide, C is the polysilicon gate (CMOS applications), D is the sidewall oxide spacer, and E is the first dielectric layer.

An optional platinum silicide Schottky Diode formation step may then be done. This would form a thin silicide at the bottom of the contacts.

The next step is the diffusion barrier deposition process. This layer has two functions. The first is to provide an electrically conducting layer to allow uniform metal electrodeposition across the entire wafer surface. The second is to prevent any interaction of the electrodeposited metal (copper for instance) with the silicon at the bottom of the contacts or the dielectric oxide. If silver was to be used instead of copper, the diffusion barrier would not need to prevent interaction with the silicon due to the inactivity of silver with silicon. A typical process would include titanium sputter deposition followed by rapid thermal nitridation in nitrogen or ammonia. Excellent ohmic contact is made to the active device while titanium nitride forms on the top surface.

Any other diffusion barrier process which forms good ohmic contact to the silicon, does not degrade the metal resistivity by alloying and inhibits species in the metallization layer from interacting with the silicon at the bottom of the contact or under the first dielectric (reactive sputtered TiN, LPCVD TiN, reactive sputtered TiW+N, rapid thermal nitridation of TiW...) may be utilized for the diffusion barrier process. The diffusion barrier must also be compatible with present etching technology. The thickness of this layer depends on several variables such as step coverage, diffusion barrier properties and metallization composition with a typical value being 1000A.

The next step is the nucleation layer deposition process (FIG. 3). F is the diffusion barrier and nucleation layer. Platinum is sputtered on top of the diffusion barrier.

This process must provide excellent ohmic contact to the diffusion barrier, provide an excellent nucleating surface for the electrodeposited metal, not adversely react with the electrodeposited metal to ruin its excellent resistivity (by forming alloys), be compatible with present etching technology and be chemically inert to the following masking steps. Other noble metals, such as platinum, iridium, osmium, or palladium, are also candidates for the nucleation layer thickness depends on the step coverage into the recesses of the contacts or vias.

Because only several monolayers are required for good nucleation properties, a thickness of only 250A has been successfully used. If the surface of the diffusion barrier can be treated so that it provides a proper nucleating surface, the nucleation deposition step may be deleted. Chemical etching or a chemical exchange reaction are two possible techniques to achieve this process simplification.

Figure 5:
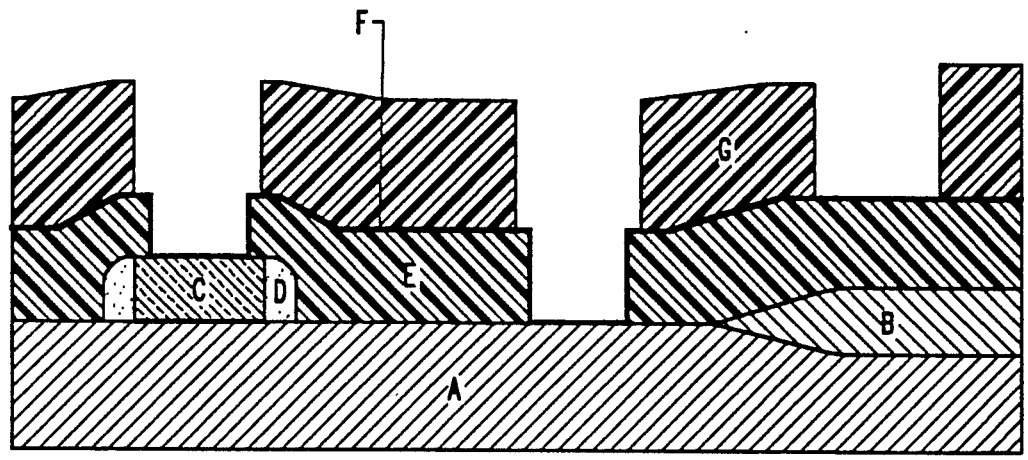

The first metal mask process follows. Photoresist spin (FIG. 4) is followed by exposure (an inverted mask is required compared to present processing requirements), developing, spin rinsing and spin drying (FIG. 5). G is the photoresist.

Various bake steps are usually performed during the masking process to optimize specific photoresist properties. Those relating to improving the etch selectivity or the etch profile are not necessary with this process flow since the resist is never subjected to a plasma etch process (no etching of the electrodeposited metal is performed). An additional complexity compared to standard processing is that resist is now present at the bottom of contacts and vias, something that does not occur when the mask follows metal deposition.

It is essential that the develop step completely remove this resist to ensure good ohmic contact of the selective electrodeposited metal to the nucleation layer/diffusion barrier.

Figure 6:
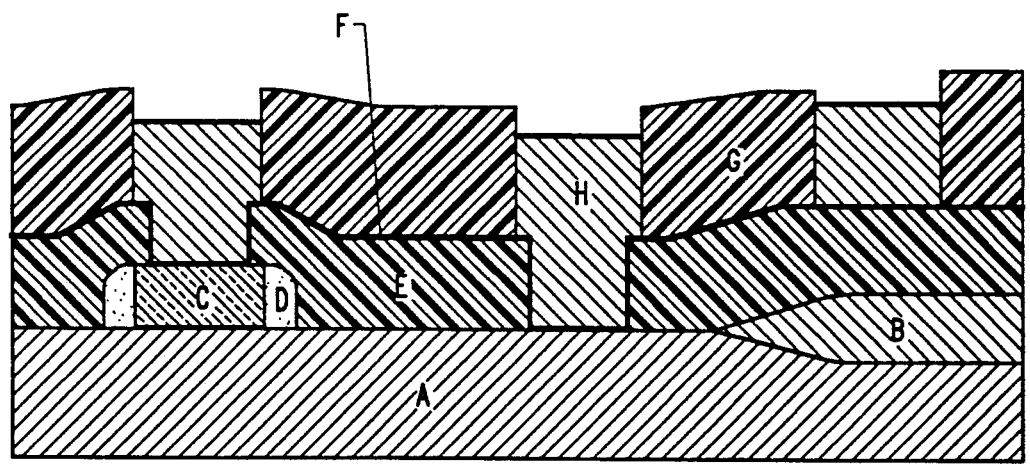

Selective metal electrodeposition follows (FIG. 6). H is the electrodeposited metal. This process step uses the hardware described below and shown in FIGS. 9, 10 and 12 to selectively deposit metal (copper for example) on the areas of the nucleation layer/diffusion barrier which are exposed to the electrolyte (areas where photoresist was developed away). This includes lines defined by photoresist as well as contacts or vias residing within these lines.

Figure 7A:
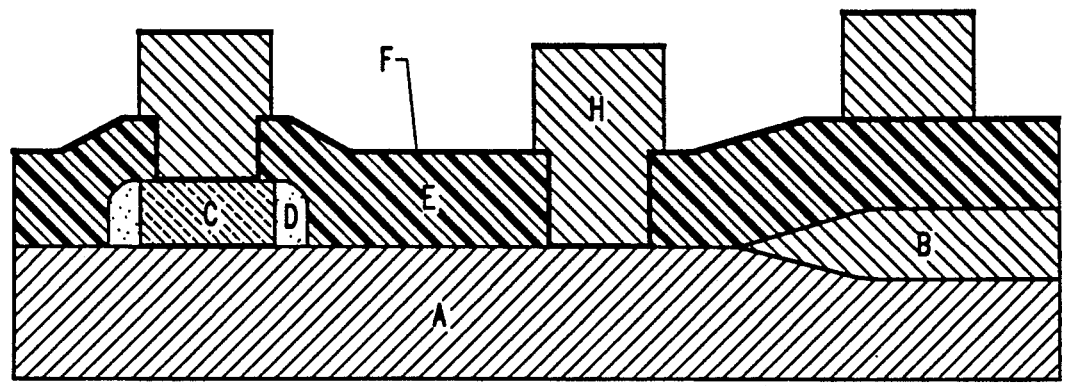

Photoresist removal is the next step (FIG. 7a). Plasma or wet photoresist strip can be utilized. It must not significantly attack the selectively deposited metal, the nucleating layer or the diffusion barrier.

Figure 7B:
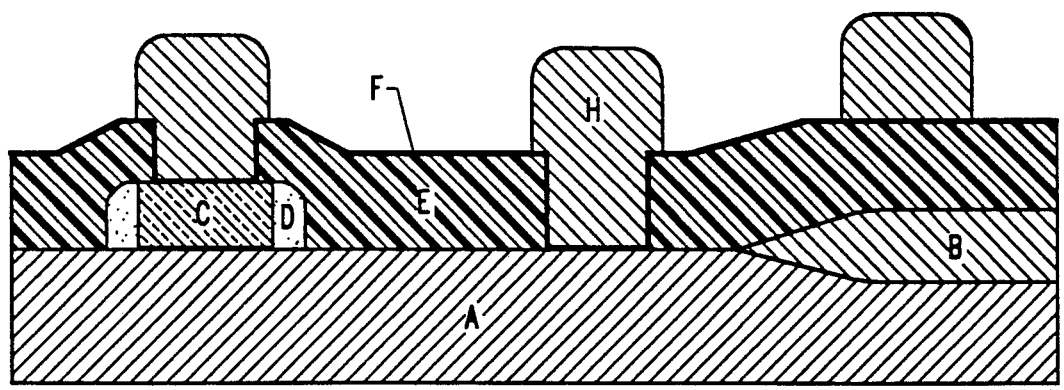

An optional electrochemical metal etch step can be done next. By reversing the direction of the electrodeposition current, metal ions leave the electrodeposited metal H predominantly at the edges and corners of the metal lines H wherein the electric field is strongest, thereby increasing the radius of curvature of the edges and corners (FIG. 7b). Advantages include simplified planarization processing and decreased line to line capacitance (a device performance enhancement).

Figure 8:
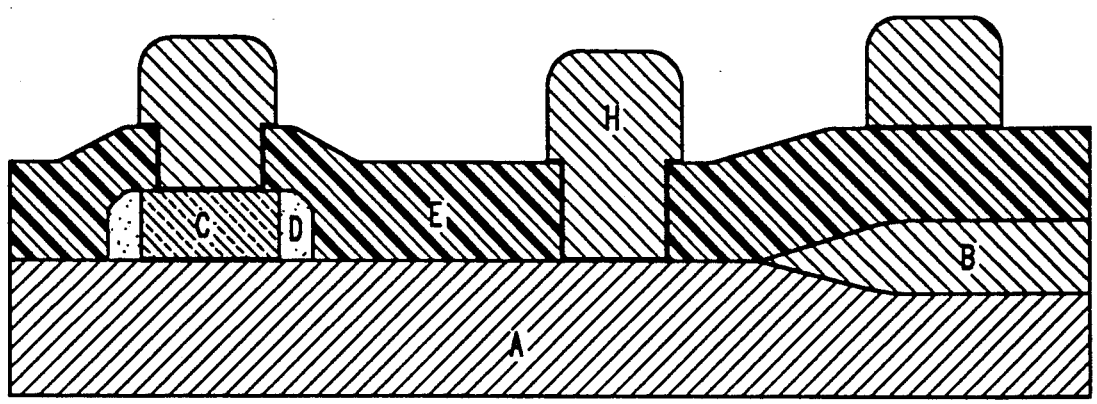

The nucleation layer and diffusion barrier blanket etch step is next (FIG. 8). Plasma or wet etching techniques may be used. The process must not etch or undercut the electrodeposited metal or etch the underlying dielectric. A typical process would wet etch the platinum (the titanium nitride and electrodeposited metal would be inert in this aqueous solution) and dry etch the remaining titanium nitride (the oxide and electrodeposited metal would not etch significantly in this plasma process).

The second dielectric deposition process follows. A thin silicon nitride layer (approximately 500A) is deposited followed by whatever silicon dioxide is required for second layer dielectric planarization. Planarization of this layer would proceed similarly to standard processing. The nitride acts as a diffusion barrier and adhesion layer to the electrodeposited metal (copper or silver).

This complexity (compared to standard processing) is proposed because copper and silver are known to diffuse rapidly in silicon dioxide as well as exhibit poor adhesion properties to silicon dioxide. For non-volatile memory applications, the silicon nitride must also be UV transparent. This may be achieved by properly controlling the deposition conditions to yield the proper composition and stoichiometry.

The second dielectric via mask and etch steps are next. The via etch process will have to be slightly modified (compared to standard processing of silicon dioxide dielectrics) to properly etch the thin silicon nitride present at the bottom of the vias. Selectivity of the etch to the electrodeposited metal must be high, similar to that of presently used metals such as aluminum.

ALTERNATIVE PROCESS FLOW

An alternative to the above process flow inserts a selective tungsten plug process after contact etch and preceding diffusion barrier deposition. This essentially creates a flat surface for metallization.

This alternative process flow has the advantage of not requiring the selective metal deposition step to have good step coverage properties into contacts or vias. The metal resistivity is that of the electrodeposited metal, a distinct advantage. Disadvantages include higher costs and slower throughput due to the tungsten step. No aluminum is involved so electromigration concerns are minimized.

Another potential disadvantage is the concern that selective tungsten plugs may cause junction leakage when applied to a first metal process.

DETAILED DESCRIPTION OF THE PREFERRED EMBODIMENT

Figure 9:
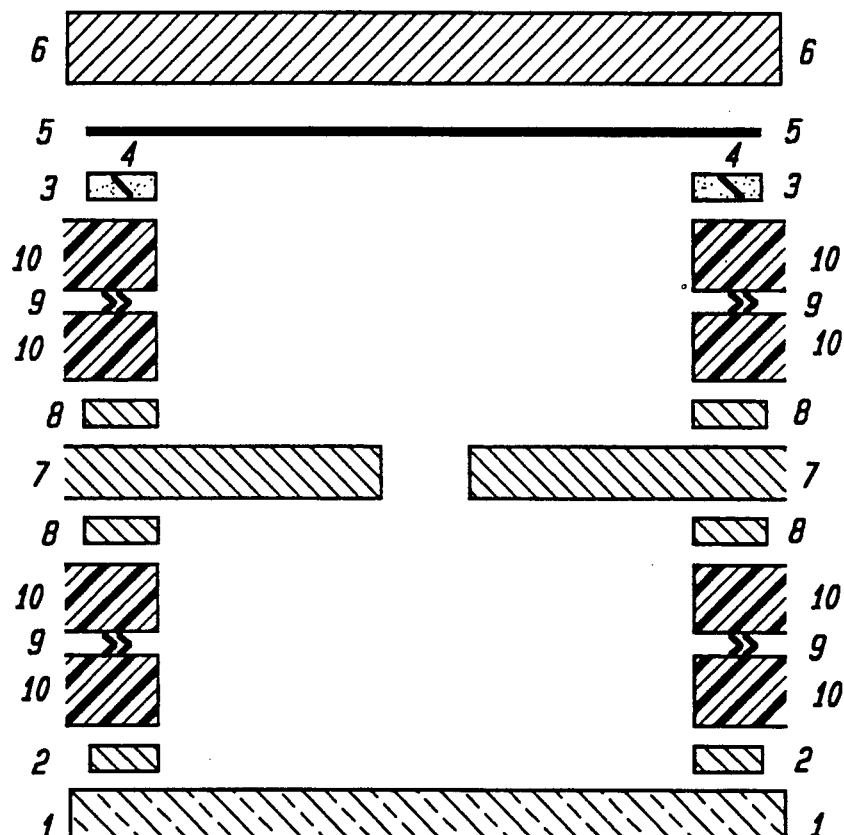
FIG. 9 depicts a cross-section diagram of apparatus for electrodeposition of metal according to the present invention.

In FIG. 9 the electrode 1 is named the anode (although for a fraction of the time it maybe the cathode when pulse plating is employed). A net loss of metal occurs at this electrode, hence the name anode. Phosphorized copper is utilized with copper plating in a sulfuric acid electrolyte (similar to printed circuit board applications). Pure copper may be employed if so desired, but may adversely affect anodic polarization and particulate generation. Other metal systems (such as silver or gold) would use that particular metal as the anode. An inert anode could also be used with the complication of constantly changing the electrolyte composition. The area of this electrode is similar to the area of the exposed wafer.

References in the printed circuit board literature imply that there is an optimum anode current density utilizing the acid copper bath for proper anode passivation. This will depend on the exposed area of the wafer (area without photoresist) as well as the deposition current density. This may not prove to be as important a parameter with this process due to the thinner nature of the deposited layer compared to printed circuit board application thicknesses (0.5 microns compared to 25 microns).

Masking part of the anode could be used to decrease the area of the anode exposed to the electrolyte if a specific (larger) anode current density is necessary.

The anode gasket 2 seals the anode to the cell body 10 preventing leakage of the electrolyte. This gasket must be inert with respect to the electrolyte. For acid copper plating, Viton or PTFE (teflon) materials are excellent choices. Other electrolyte and metal systems must be addressed accordingly. The anode 1 is secured firmly to the anode gasket 2. Since the anode is not changed for a multitude of wafers, it is secured in a permanent manner to the cell (using clamps or bolts).

The cathode gasket 3 has the same inertness requirements as the anode gasket 2. Its function is to seal the cathode to the cell and prevent electrolyte leakage.

Figure 10A:
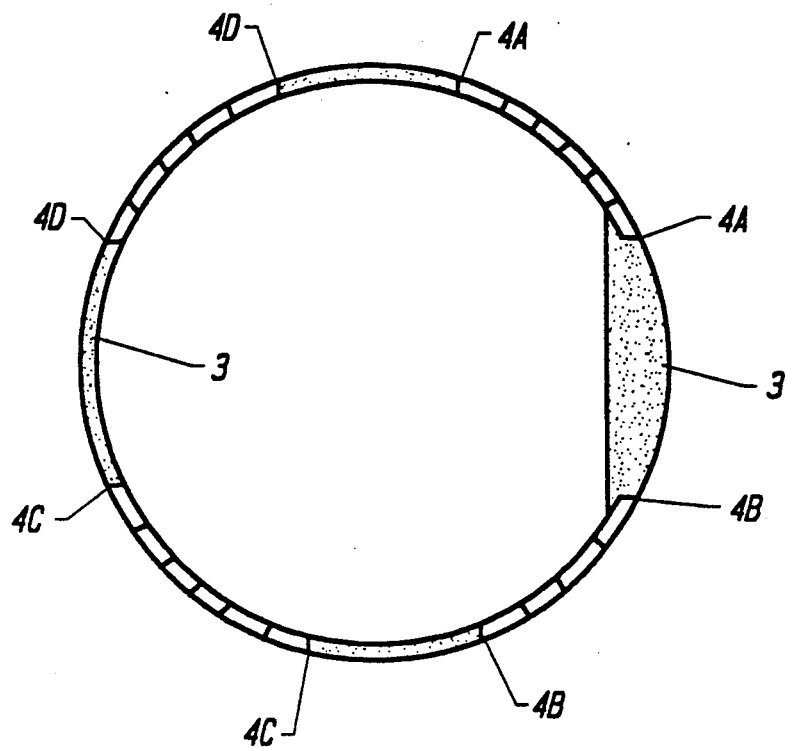
FIG. 10A shows a more detailed view of cathode wires sewn into a cathode gasket of FIG. 9.
Figure 10B:
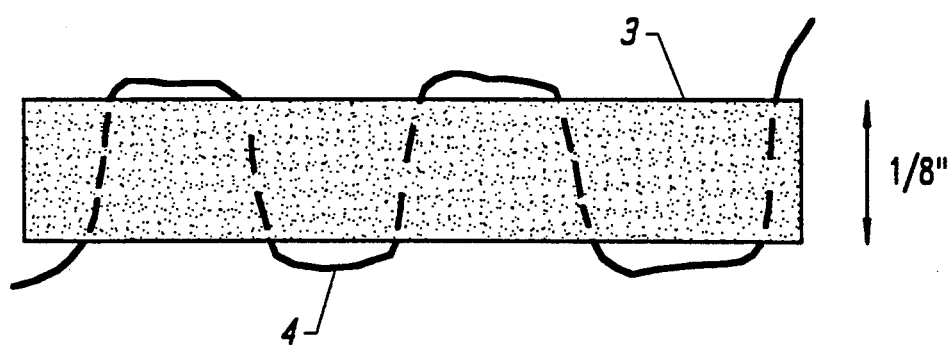
FIG. 10B shows a closeup of the cathode wires passing through the cathode gasket.

Cathode wires 4, (A,B,C and D) are sewn into cathode gasket 3 as shown in FIG. 10A. In order to maximize the exposed area of wafer 5 to the electrolyte, the cathode gasket 3 is not round, it follows the circumference of the wafer which has flat regions oriented with specific crystallographic orientations. FIG. 10B shows a close up view of a cathode wire passing through a section of the cathode gasket 3.

By matching the shape of the gasket to the wafer, a uniform displacement of the cathode wires 4 from the edge of the wafer is achieved while preventing electrolyte leakage between cathode gasket 3 and wafer 5 due to wafer flats. Obviously, the wafer must be properly oriented when placed on wafer gasket 3.

Referring back to FIG. 9, when the cathode (wafer) 5 is secured against the cathode gasket, 3, electrolyte is excluded from contacting the area of the wafer contacting this cathode gasket 3 as well as the cathode wires 4. The cathode wires 4 penetrate the photoresist (where present) on the active side of the wafer and make ohmic contact with the nucleating layer/diffusion barrier (this would be the top surface observed in FIG. 5). Four separate cathode wires 4 (A,B,C and D) are employed to allow the confirmation of good contact between the wafer and electrode wires (by making a resistance measurement) before electrolyte is introduced into the cell and electrodeposition is initiated. A knowledge of the diffusion barrier/nucleation layer sheet resistance along with the cell geometry will allow the determination of good cathode wire to cathode contact. Wires A and C may be checked followed by the resistance between wires B and D.

This concept may be extended to include even more cathode wires if desired. After this check has been made, all, cathode wires 4 (A,B,C and D) are connected together to act as a single cathode wire making multiple contacts to the wafer 5.

The wafer is the cathode 5 with the active side facing the cathode gasket 3 (the side with photoresist and nucleation layer metal shown in FIG. 5). The area of the cathode 5 encircled by the cathode gasket 3 is exposed to the electrolyte. The fraction of this area that is not covered by photoresist (exposed nucleation layer metal) is the actual plating area. The edge of the cathode 5 in contact with the cathode gasket 3 and the back of the wafer are not exposed to the electrolyte. Neither are the cathode wires 4 that are woven into the cathode gasket 3.

Wafer clamp 6 applies pressure to the back of the cathode 5 to secure the wafer firmly against the cathode gasket 3 and make good contact to cathode wires 4. It must seal the cathode 5 well enough to prevent electrolyte from leaking between the cathode 5 and cathode gasket 3 and the cathode gasket 3 and cell body 10. This will also ensure that cathode wires 4 do not contact the electrolyte.

Its configuration must be such that it is compatible with moving wafers on and off the cathode gasket 3 with the wafer handling apparatus. Another requirement of the wafer clamp 6 is that it apply a uniform force to the cathode 5. If any bending (non-uniform) force is applied to the wafer, this extrinsic stress will be added to the intrinsic stress of the electrodeposited metal. The probable result will be undesirable and non-uniform stress in the metal layer. A more desirable approach is to not apply extrinsic stress with wafer clamp 6 and to deposit a low stress film resulting in a metal layer of low and uniform total stress.

The virtual anode 7 is so named due to its manipulation of the cell geometry to create a primary current distribution that does not coincide with the real anode and cathode geometry, but with an anode that approximately coincides with the opening in the virtual anode 7. The advantage of this is that it creates a more uniform primary current distribution which has beneficial consequences on the deposited metal thickness uniformity.

A comparison of the cross-sections of the cells shown in FIGS. 11A and 11B illustrates the more uniform potential distribution near the cathode surface (which implies a more uniform primary current distribution) using a virtual anode compared to a cell with no virtual anode. Additionally, a virtual anode is much simpler to construct than a complexly shaped anode to achieve a desired primary current distribution. Without the virtual anode, there is a greater tendency for the thickness of the deposited metal to be greater closer to the cathode wires 4. Manipulation of the process variables can now be done to optimize other metal layer requirements (stress, film morphology and step coverage) without concern about degrading thickness uniformity.

Alternatively, by using a virtual anode, the acid content of the electrolyte can be decreased if more photoresist inertness is desired without degrading the metal thickness uniformity. Another potential advantage is that a higher current density (growth rate) can be used with a virtual anode to achieve a desired thickness uniformity.

Also, the fluid dynamics of the anode compartment and cathode compartment can be individually optimized. In addition, any particulate generation from the anode can be partially isolated from the cathode compartment by the virtual anode. The size and shape of the virtual anode opening, the wafer size, the nucleating layer/diffusion barrier sheet resistance, the electrolyte conductivity, the anode to virtual anode distance and the cathode to virtual anode distance are manipulated to optimize the uniformity of the primary current distribution.

Virtual anode gaskets 8 seal the virtual anode 7 to the cell body 10 preventing electrolyte leakage. Different virtual anodes can be easily exchanged to optimize the primary current distribution using this configuration.

Electrolyte inlets and outlets 9 establish proper fluid dynamic conditions in the anode compartment and cathode compartment. A single pump and filtration system may feed both compartments, or two separate systems may be employed to optimize each compartment.

The number and geometry of these inlets and outlets are chosen to provide a controlled and uniform electrolyte boundary layer thickness over the entire exposed cathode and anode surfaces. This is critical for achieving proper film properties such as film morphology, stress and step coverage on the cathode as well as establishing a proper passivation layer on the anode.

Filtration of the electrolyte in the anode compartment also needs to be optimized to minimize any particulates (generated by the anodic corrosion process) from entering the cathode compartment.

The pump 11, filtration system 12, temperature controller 13, reservoir 14 and fluid tubing 15 complete the cell as shown in FIG. 12. Their function is to provide a clean, constant temperature, controlled flow of electrolyte 16 to the cell, while minimizing any external contamination or evaporation.

The electronics 17 (shown schematically in FIG. 12) applies a voltage or current to the cell (potentiostat or galvanostat mode) in a controlled manner. A voltmeter measures cell potentials, an ammeter monitors cell currents and a couloneter measures the amount of charge passed through the cell.

The use of a coulometer along with the knowledge of the exposed area of the wafer (area without photoresist) and the coulombic efficiency (very close to 100% with the acid copper process) will allow the average thickness of the film to be monitored during the deposition process, typically impossible with present deposition techniques.

The complete cell and electronics may comprise a part of a total system that includes wafer handling, wafer cleaning, other wafer processing (such as resist strip) and laminar gas flow. There may also be a multitude of cells and electronics if multiple wafers are to be processed simultaneously to improve throughput.

Table I compares current and proposed metallization processes with the selective metal electrodeposition scheme. Each currently used process has some significant disadvantage when used in an advanced semiconductor process. The present invention has no apparent major disadvantage.

FEATURES OF THE PRESENT INVENTION compatibility with present state of the art process flows with respect to economics and performance compatible with salicide, Schottky diodes, submicron contacts and vias and GaAs processes. It may be employed for first metal or any subsequent metal layer.

this process may be employed to form heat sink layers between active metal layers or as ground planes between metal layers. The possibility of performing both functions simultaneously also exists.

employs a diffusion barrier which conducts electrons to all parts of the cathode surface allowing uniform metal electrodeposition as well as providing a barrier to metal species interfering with properties of the underlying active devices.

uses a nucleation layer for optimum electrodeposited film morphology. This does not hinder device performance while only increasing process complexity slightly.

an inverted metal mask is required as compared to present masking technology. The requirement of removing resist from the bottom of contacts or vias to ensure good ohmic contact between the electrodeposited metal and the nucleation layer/diffusion barrier is added. This is a consequence of the mask step preceding the metal deposition instead of following it as is the case with standard metal processing.

improved linewidth control is a result of the resist profile defining the metal linewidth without bias from the standard metal etch step which is essentially eliminated (a blanket nucleation layer/diffusion barrier etch does not significantly affect metal linewidth).

decreased line-to-line capacitance.

simplified planarization processing.

experimental operating conditions:

electrolyte temperature 20°-25° C.

12 ounces/gallon of water $CUSO_4.5H_2O$

10% by volume concentrated sulfuric acid 50 parts per million (PPM) chloride ion from hydrochloric acid TECHNI-COPPER U additive 0.4% by volume (this is a product of Technic Inc. P.O. Box 965, Providence, RI 02901)

a small cell of approximately 42 milliliters with two electrolyte inlets and two electrolyte outlets was employed. The flow rate was approximately 1.5 liters per minute. No virtual anode was employed.

cathode current density of 5 mA/cm2 (DC)

film thickness of 5000A any other set of above conditions which meet the requirements for metal thickness uniformity, film morphology, film resistivity, step coverage and throughput will also be acceptable.

the control of micro-levelling, geometric leveling and mass transport conditions allows the formation of a metal line with void-free contacts or vias in a single deposition step (step coverage in excess of 100%).

An alternative process flow utilizing selective tungsten plugs removes the requirement for excellent step coverage of the selective metal electrodeposition process while keeping the advantages of low resistivity metal and no electromigration concerns.

The standard metal etch step is much simplified to a blanket etch step only having to remove the nucleation layer and diffusion barrier between electrodeposited metal areas. No plasma etching of the electrodeposited metal is required.

a modified second dielectric deposition process is employed to avoid complications due to the rapid diffusion of copper or silver in silicon dioxide and adhesion complexities. A slight modification of the second dielectric via etch process will also have to be made to compensate for the (thin) silicon nitride at the bottom of the vias.

system allows execution of selective metal electrodeposition process in a semiconductor wafer process flow meeting all future metallization requirements while providing economical and reliable alternative to presently considered processes.

system prevents electrolyte from contacting back surface of wafer (cathode) as well as cathode wires due to unique cathode gasket and cathode wire configuration.

Wafer is secured against cathode gasket in a uniform manner preventing complications from added extrinsic stress.

system is sealed and minimizes external contamination of electrolyte and evaporation.

the virtual anode improves the primary current distribution improving the metal thickness uniformity while allowing process variables to be optimized for other electrodeposited film properties (film morphology, stress and step coverage). It also allows independent optimization of the fluid dynamic conditions in the cathode compartment and the anode compartment. It allows the possible particulate generation problem from the anode to be minimized as well.

virtual anode gaskets prevent electrolyte leakage and make it a simple and rapid process to change the geometry of the virtual anode. This is done to optimize the primary current distribution for different diffusion barrier sheet resistances and electrolyte compositions.

the electrolyte inlets and outlets along with the cell geometry, pump, pumping rate and electrolyte tubing establish the proper fluid dynamic conditions for uniform diffusion layers on the anode and cathode. This is essential for achieving uniform and reproducible electrodeposited film properties and a properly passivated anode.

the associated electronics applies the desired potential or current, measures cell potentials, currents and charge. It provides the unique feature of allowing the average film thickness to be measured during the deposition process.

this described cell is part of a system that incorporates wafer handling and other components common to semiconductor processing equipment °(laminar flow, computer for human interfacing. . . ).

TABLE I

COMPARISON OF PRESENT AND PROPOSED METALLIZATION PROCESSES

| PROCESS | RESISTIVITY (micro-ohm-cm) | STEP COVERAGE | ECONOMICS | THROUGHPUT | RELIABILITY |
|---|---|---|---|---|---|
| sputtered aluminum | good 3.0 | poor | good | good | fair |
| LPCVD aluminum | good 3.0 | excellent | fair | fair | fair |
| hot aluminum | good 3.0 | good | fair | fair | fair |
| reflowed aluminum | good 3.0 | good | fair | fair | fair |
| LPCVD W | fair 8.0 | excellent | fair | fair | excellent |
| W plugs/ aluminum | good 3.0 | excellent | fair | fair | fair |
| SELECTIVE COPPER | excellent 2.0 | excellent | excellent | excellent | excellent |

TABLE II

SILICON PROCESS FLOW UTILIZING SELECTIVE METAL ELECTRODEPOSITION FOR THE FIRST METAL LAYER
FRONT END WAFER PROCESSING (ACTIVE DEVICE FORMATION)
FIRST DIELECTRIC PROCESSING
CONTACT ETCH
PLATINUM SILICIDE FORMATION (OPTIONAL)
DIFFUSION BARRIER DEPOSITION
NUCLEATION LAYER DEPOSITION
FIRST METAL MASK
SELECTIVE METAL ELECTRODEPOSITION
PHOTORESIST REMOVAL
ELECTROCHEMICAL METAL ETCH
NUCLEATION LAYER/DIFFUSION BARRIER BLANKET ETCH
SECOND DIELECTRIC DEPOSITION/PLANARIZATION
SECOND DIELECTRIC VIA MASK AND ETCH

What is claimed is:

1. A wafer level sub micron interconnect metallization process for electrodeposition of metal such as copper, silver or gold onto a semiconductor wafer having an active layer such as silicon, said process comprising the steps of depositing an electrically conducting layer on said wafer having contacts and vias, to prevent metal diffusion to said silicon, and to provide a sufficient adhesion surface for the electrodeposited metal, placing, using an inert photoresist metal mask process, a first metal mask layer onto said wafer, selectively depositing said metal onto said conducting layer of said semiconducting wafer to form one or more lines, removing said first metal mask layer from said wafer, and electrochemically etching to increase a radius of curvature of edges of said lines, thereby facilitating planarization and decreasing line-to-line capacitance.

2. The method of claim 1 including the step of forming heat sink layers between one or more active metal layers or as ground planes between said metal layers.

3. A wafer level sub micron interconnect metallization process for electrodeposition of metal such as copper, silver or gold onto a semiconductor wafer having an active layer such as silicon, said process comprising the steps of providing a semiconductor wafer with active device semiconductor, depositing, using a diffusion barrier deposition process, an electrically conducting layer on said wafer to provide adequate adhesion to said wafer, to provide ohmic contact to said wafer and to prevent metal diffusion to said active device semiconductor or other semiconductor areas of said wafer, depositing, using an electrically conducting nucleation layer deposition process, an ohmic contact to diffusion barrier layer which provides a sufficient adhesion surface and nucleation surface for the electrodeposited metal, placing a non-conducting mask onto said diffusion barrier/nucleation layer on said semiconductor wafer, selectively depositing said metal onto said diffusion barrier/nucleation layer on said semiconductor wafer to form one or more lines having corners and edges, removing the non-conducting mask while not adversely affecting the electrodeposited metal, and electrochemically etching to increase a radius of curvature of the corners and edges of metal lines to simplify planarization processing and decrease line to line capacitance.

4. The method of claim 3 wherein the diffusion barrier has an approximate thickness of 1000 Angstroms and is one of the following:
   A) titanium sputter deposition rapid thermal nitridation (with nitrogen or ammonia) to form titanium nitride
   B) reactively sputtered titanium nitride
   C) low pressure chemical vapor deposition (LPCVD) titanium nitride
   or titanium-tungsten instead of titanium, and titanium-tungsten nitride instead of titanium nitride, in A) and B).

5. The method of claim 3 wherein the nucleation layer is one of the following:
   A) sputtered platinum, iridium, osmium, or palladium having an approximate thickness of 250 Angstroms
   B) a chemically treated diffusion barrier, said chemically treated diffusion barrier providing a surface for adequate nucleation of the electrodeposited metal.

6. The method of claim 3 wherein the electrodeposition process uses copper or silver.

7. The method of claim 1 wherein said selective electrodeposition process simultaneously fills one or more contacts or vias while forming said lines.

8. The method of claim 3, further comprising a dielectric deposition process to provide adequate adhesion to the electrodeposited metal and act as a diffusion barrier to prevent the electrodeposited metal from diffusion in a major constituent of the dielectric layer, each of the vias having a bottom, and a dielectric via process to expose the electrodeposited metal at the bottom of the vias.

9. The method of claim 8 wherein said selective electrodeposition process simultaneously fills one or more contacts or vias while forming said lines.

* * * * *